United States Patent [19]

Frerking et al.

[11] Patent Number: 5,053,651

[45] Date of Patent: Oct. 1, 1991

[54] DEGLITCHED DIGITAL MIXER CIRCUIT

[75] Inventors: Marvin E. Frerking, Cedar Rapids; Roy W. Berquist, Toddville, both of Iowa

[73] Assignee: Rockwell International Corporation, El Segundo, Calif.

[21] Appl. No.: 576,134

[22] Filed: Aug. 28, 1990

Related U.S. Application Data

[63] Continuation of Ser. No. 264,429, Oct. 31, 1988, abandoned.

[51] Int. Cl.$^5$ .......................... H03B 19/00; G06G 7/00
[52] U.S. Cl. ........................ 307/529; 307/443; 307/272.1; 307/247.1; 328/111; 328/158
[58] Field of Search ............... 328/133, 134, 111, 158, 328/160, 162, 165; 307/529, 491, 247.1, 443, 272.1, 272.3, 234

[56] References Cited

U.S. PATENT DOCUMENTS

| | | | |
|---|---|---|---|
| 3,610,954 | 10/1971 | Treadway | 307/232 |
| 3,906,382 | 9/1975 | Miyamoto et al. | 328/134 |
| 4,267,514 | 5/1981 | Kimsey | 328/133 |
| 4,385,395 | 5/1983 | Tanaka et al. | 375/110 |
| 4,385,401 | 5/1983 | Jagnow et al. | 455/326 |
| 4,399,412 | 8/1983 | Rinaldi | 307/234 |
| 4,467,285 | 8/1984 | Rinaldi | 307/234 |
| 4,468,784 | 8/1984 | Jagnow et al. | 375/1 |
| 4,525,635 | 6/1985 | Gillberg | 307/234 |
| 4,739,278 | 4/1988 | Des Brisay, Jr. et al. | 328/133 |
| 4,775,840 | 10/1988 | Ohmori et al. | 328/111 |

FOREIGN PATENT DOCUMENTS

58-62928 4/1983 Japan.
0189317 9/1985 Japan .................. 307/443

Primary Examiner—Timothy P. Callahan
Attorney, Agent, or Firm—John C. McFarren; John J. Horn; H. Fredrick Hamann

[57] ABSTRACT

A digital mixer employs a plurality of flip-flops to mix two digital input signals and provide a beat frequency output. The first input signal is provided as a clock signal to a first D flip-flop and to a third JK flip-flop. The second input signal is provided as a clock signal to a second D flip-flop. The inverted output of the first flip-flop is provided as a clock input to a fourth JK flip-flop. The non-inverted and inverted outputs of the second flip-flop are connected, respectively, to the J and K inputs of the third flip-flop. The non-inverted outputs of the second and third flip-flops are input to a first AND gate, the output of which connects to the J input of the fourth flip-flop. Likewise, the inverted outputs of the second and third flip-flops are input to a second AND gate, the output of which connects to the K input of the fourth flip-flop. The non-inverted output of the fourth flip-flop provides a beat frequency that is one-half the difference frequency of the two input signals. The third flip-flop in the digital mixer prevents glitches around the transition time of the beat frequency output even for very low beat frequencies.

8 Claims, 1 Drawing Sheet

DEGLITCHED DIGITAL MIXER CIRCUIT

This application is a continuation of application Ser. No. 07/264,429 filed Oct. 31, 1988, now abandoned.

TECHNICAL FIELD

The present invention relates to electrical circuits that mix input signals and, in particular, to a digital mixer designed to prevent spurious indications in the beat frequency output.

BACKGROUND OF THE INVENTION

In electrical circuits that use flip-flops as digital mixers, spurious transitions or spikes, generally referred to as glitches, may be generated. In conventional circuits using a flip-flop as a digital mixer, glitches in the output signal are likely to occur when the input signals drift through an in-phase condition. When the input signals change state simultaneously, the mixer flip-flop may or may not be properly clocked and may assume the 0 or 1 states randomly for several successive clocks. As a result, the beat frequency output may include undesirable spurious transitions.

Thus, there is a need for a simple digital mixer that employs flip-flops and prevents the generation of glitches in the beat frequency output even for very low beat frequencies.

SUMMARY OF THE INVENTION

The present invention comprises four flip-flops connected in a circuit that performs the function of a digital mixer. The beat frequency output of the digital mixer is one-half the difference frequency between two input signals.

The digital mixer of the present invention receives two digital input signals $S_1$ and $S_2$ that generally have independent and unrelated frequencies. $S_1$ is input as a clock signal to a first D flip-flop and to a third JK flip-flop. $S_2$ is input as a clock signal to a second D flip-flop. The inverted output of the first flip-flop is provided as a clock input to a fourth JK flip-flop. The non-inverted and inverted outputs of the second flip-flop are connected, respectively, to the J and K inputs of the third flip-flop. The non-inverted outputs of the second and third flip-flops are input to a first AND gate, which provides the J input to the fourth flip-flop. Likewise, the inverted outputs of the second and third flip-flop are input to a second AND gate, which provides the K input to the fourth flip-flop. The purpose of the third flip-flop is to prevent extraneous transitions or glitches in the beat frequency output $Q_4$ of the fourth flip-flop. In the digital mixer of the present invention, $Q_4$ cannot make a transition from 0 to 1 unless the non-inverted outputs from the second and third flip-flops are both high. Likewise, $Q_4$ cannot make a transition from 1 to 0 unless the inverted outputs of the second and third flip-flops are both low. Thus, as long as the jitter on signals $S_1$ and $S_2$ is less than one-half cycle, the digital mixer of the present invention prevents glitches around the transition time of the beat frequency output $Q_4$ even for very low beat frequencies. Furthermore, the digital mixer of the present invention is particularly effective when $S_1$ and $S_2$ are nearly equal in frequency and the near in-phase condition persists for a relatively long time.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which.

DESCRIPTION OF THE PREFERRED EMBODIMENT

Figure 1:
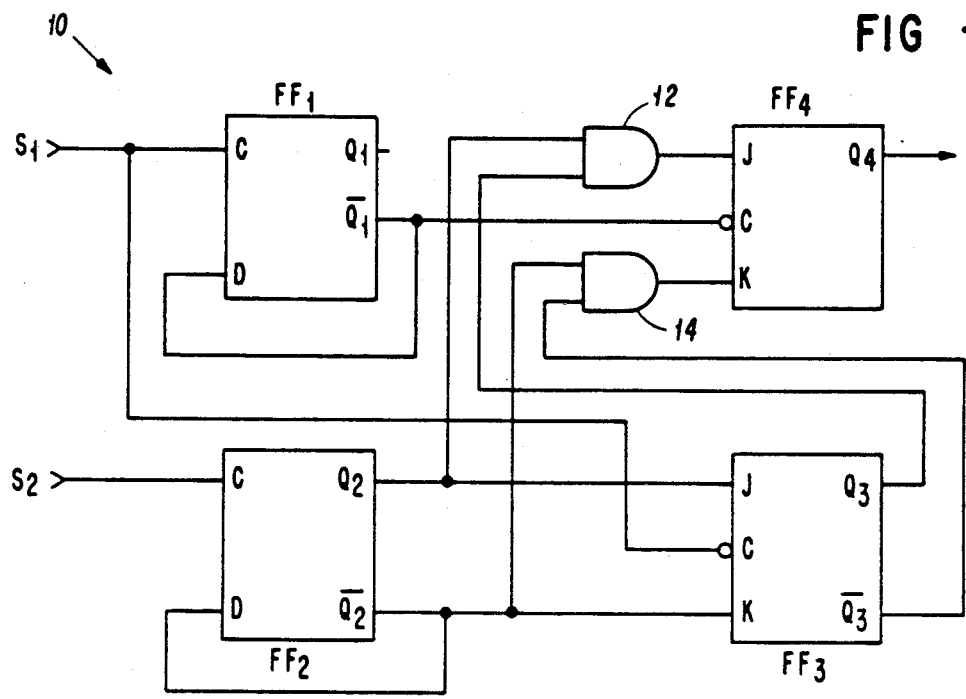
FIG. 1 is a functional block diagram of the digital mixer circuit of the present invention.

FIG. 1 is a functional block diagram of a digital mixer circuit 10 of the present invention. Signals $S_1$ and $S_2$ are provided as inputs to digital mixer 10. Signal $S_1$ is connected to the clock input of a D flip-flop $FF_1$ and to the clock input of a JK flip-flop $FF_3$. An inverted output $\overline{Q}_1$ of $FF_1$ is connected to the clock input of a JK flip-flop $FF_4$ and is fed back to the D input of $FF_1$ to halve the frequency of input signal $S_1$. The second input signal $S_2$ is connected to the clock input of D flip-flop $FF_2$. A non-inverted output $Q_2$ of $FF_2$ is connected to the J input of $FF_3$. The inverted output $\overline{Q}_2$ of $FF_2$ is connected to the K input of $FF_3$ and is fed back to the D input of $FF_2$ to halve the frequency of input signal $S_2$. The non-inverted outputs $Q_2$ and $Q_3$ of $FF_2$ and $FF_3$, respectively, are provided as inputs to an AND gate 12, the output of which is connected to the J input of $FF_4$. Likewise, the inverted outputs $\overline{Q}_2$ and $\overline{Q}_3$ are provided to an AND gate 14, the output of which is connected to the K input of $FF_4$. A non-inverted output $Q_4$ of $FF_4$ provides a beat frequency output of digital mixer 10.

Figure 2:
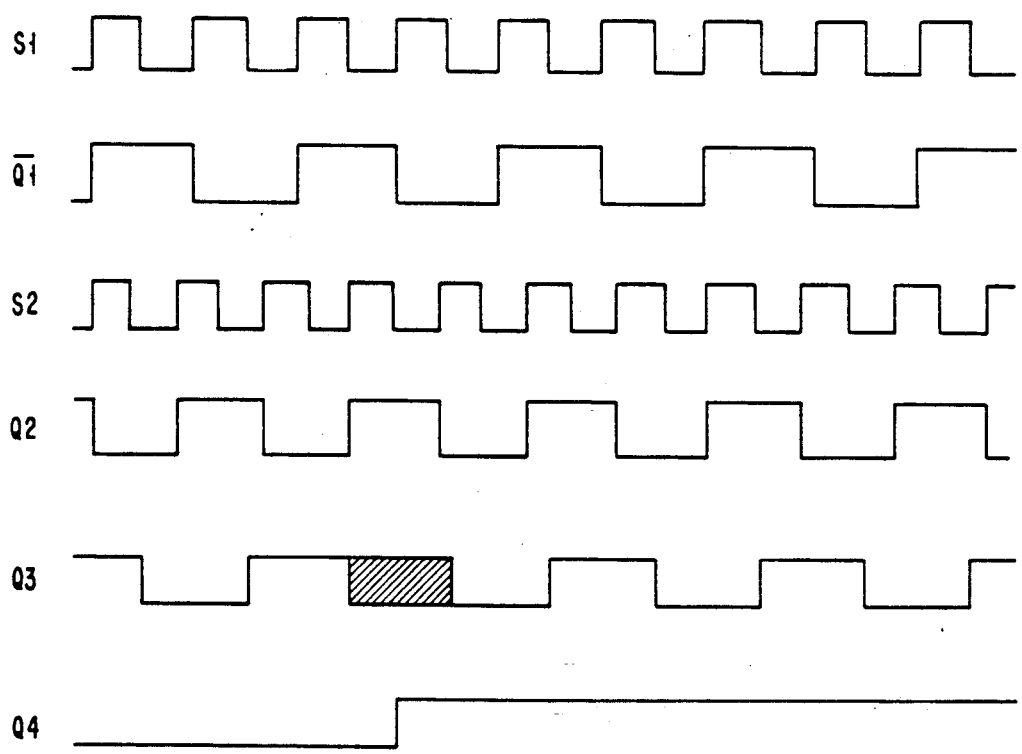
FIG. 2 is a waveform timing diagram of the digital mixer of the present invention.

Referring to the timing diagram of FIG. 2, various waveforms of digital mixer 10 are illustrated. As shown in FIG. 2, $\overline{Q}_1$ is one-half the frequency of input signal $S_1$. Likewise, $Q_2$ is one-half the frequency of input signal $S_2$. $Q_3$ is output by $FF_3$, which is clocked by the negative edge of input signal $S_1$. $FF_3$ could be clocked equally well by the negative edge of input signal $S_2$. Because $Q_1$ is one-half the frequency of input $S_1$, the transitions of $Q_3$ lag those of $Q_1$ by one-fourth period. As shown in FIG. 1, $Q_2$ and $Q_3$ are input to AND gate 12, which connects to input J of $FF_4$. Likewise, $\overline{Q}_2$ and $\overline{Q}_3$ are provided to AND gate 14, which connects to input K of $FF_4$. As a result, $Q_4$ cannot make a transition from 0 to 1 unless both $Q_2$ and $Q_3$ are high.

$FF_4$ is clocked by the negative edge of $\overline{Q}_1$. For the case shown in FIG. 2 with the frequency of $S_2$ greater than that of $S_1$, $Q_2$ will be high first (when $FF_4$ is clocked) and then a few clock cycles later $Q_3$ will also go high. When this occurs, both inputs to AND gate 12 are high and $Q_4$ is clocked high on the next negative edge of $\overline{Q}_1$. With $Q_4$ high, if $Q_3$ is not clocked high on the next cycle due to clock jitter, $Q_4$ will remain high because $Q_2$ is still high and $\overline{Q}_2$ input to AND gate 14 is still low. Thus, $Q_4$ cannot go low momentarily unless the phase of $S_2$ changes sufficiently so that both $Q_2$ and $Q_3$ are low (which requires a one-fourth cycle change in $S_2$). Since the jitter on $S_1$ and $S_2$ normally is much less than one-fourth cycle, no glitches are generated. Digital mixer 10 is particularly effective when $S_1$ and $S_2$ are nearly equal in frequency and the near in-phase condition persists for a relatively long period of time.

The cross-hatched area of waveform $Q_3$ of FIG. 2 illustrates a possible ambiguity. If the frequency of signal $S_1$ jitters only slightly, the cross-hatched area of $Q_3$ may be either high or low. To illustrate the immunity from glitches of the present invention, assume that signals $S_1$ and $S_2$ are at the same frequency and in the phase relationship shown at the left most edge of the cross-hatched area of $Q_3$. In this case, $Q_3$ may alternate between the high and low states in a random fashion. If $Q_3$ is high during any cycle, $Q_4$ will go high as illustrated. If $Q_3$ then goes low during the next cycle due to phase jitter, $Q_4$ will remain high because $Q_2$ is high during the low-to-high transition of signal $S_1$. Thus, $Q_2$ would have to change by one-fourth cycle before $Q_4$ could go low. As a result, multiple spikes on the output $Q_4$ are prevented.

Although the present invention has been described with respect to a specific embodiment thereof, various changes and modifications may be suggested to one skilled in the art, and it is intended that the present invention encompass such changes and modifications as fall within the scope of the appended claims.

We claim:

1. A digital mixer circuit adapted for processing first and second mixer input signals in order to produce a beat frequency output signal and for suppressing the production of glitches in its beat frequency output signal, said circuit comprising:
    means for separately dividing down said first and second mixer input signals in order to produce a first divided down signal and a second divided down signal having inverted and non-inverted components;
    first flip-flop means for providing a beat frequency output signal, said first flip-flop means having a clock by said first divided down signal and having first and second signal inputs connected for receiving non-inverted and inverted components of a regulated signal from a means for gating so as to be coupled for following the transitioning of said regulated signal;
    means for delaying said second divided down signal in order to produce a phase delayed signal having non-inverted and inverted components; and
    means connected for receiving said non-inverted and inverted components of said second divided down signal and said non-inverted and inverted components of said phase delayed signal and for gating said components of said second divided down signal with said components of said phase delayed signal in order to generate said components of said regulated signal supplied to said first flip-flop and control the transitioning of said first flip-flop to occur only when said second divided down signal and said phase delayed signal assume similar logic states.

2. The digital mixer circuit of claim 1, wherein said means for delaying comprises a second flip-flop having a clock input clocked by said first mixer input signal and coupled for following the transitioning of said second divided down signal by having its first and second signal inputs connected for receiving the non-inverted and inverted components of said second divided down signal.

3. The digital mixer circuit of claim 1, wherein said first JK flip-flop comprises a JK flip-flop and said mean for gating comprises a pair of AND gates having outputs separately connected to the J and K inputs of said JK flip-flop for separately gating said components of said second divided down signal with said components of said delayed signal.

4. The digital mixer circuit of claim 2, wherein said means for dividing down said first and second mixer input signals includes a pair of D flip-flops.

5. A digital mixer circuit adapted for suppressing the production of glitches in its beat frequency output signal, said circuit comprising:
    a first D flip-flop for dividing down the frequency of a first mixer input signal to produce a first divided signal;
    a second D flip-flop for dividing down the frequency of a second mixer input signal to produce a second divided signal;
    a first JK flip-flop clocked by said first mixer input signal and coupled to follow the transitioning of said second divided signal in order to produce a delayed signal;
    AND function means for gating said second divided signal with said delayed signal and gating a complement of said second divided signal with a complement of said delayed signal in order to produce an AND function means output; and
    a second JK flip-flop clocked by said first divided signal and coupled to follow the transitioning of said output of said AND function means.

6. The digital mixer circuit of claim 5, wherein said AND function means comprises a pair of AND gates separately connected to the J and K inputs of said second JK flip-flop for separately gating said second divided signal with said delayed signal and gating a complement of said second divided signal with a complement of said delayed signal.

7. A digital mixer circuit adapted for suppressing the production of glitches in its beat frequency output signal, said circuit comprising:
    a first D flip-flop for dividing down the frequency of a first mixer input signal to produce a first divided signal;
    a second D flip-flop for dividing down the frequency of a second mixer input signal to produce a second divided signal;
    a first JK flip-flop clocked by said second mixer input signal and coupled to follow the transitioning of said second divided signal in order to produce a delayed signal;
    AND function means for gating said second divided signal with said delayed signal and gating a complement of said second divided signal with a complement of said delayed signal in order to produce an AND function means output; and
    a second JK flip-flop clocked by said first divided signal and coupled to follow the transitioning of said output of said AND function means.

8. The digital mixer circuit of claim 7, wherein said AND function means comprises a pair of AND gates separately connected to the J and K inputs of said second JK flip-flop for separately gating said second divided signal with said delayed signal and gating a complement of said second divided signal with a complement of said delayed signal.

* * * * *